United States Patent
Shaw

(10) Patent No.: US 11,903,124 B2
(45) Date of Patent: Feb. 13, 2024

(54) WIDE BAND PRINTED CIRCUIT BOARD THROUGH CONNECTOR

(71) Applicant: Rockwell Collins, Inc., Cedar Rapids, IA (US)

(72) Inventor: Daniel S. Shaw, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 287 days.

(21) Appl. No.: 17/398,937

(22) Filed: Aug. 10, 2021

(65) Prior Publication Data
US 2023/0053195 A1    Feb. 16, 2023

(51) Int. Cl.
| | |
|---|---|
| *H01R 9/05* | (2006.01) |
| *H05K 1/02* | (2006.01) |
| *H01R 12/55* | (2011.01) |

(52) U.S. Cl.
CPC .......... *H05K 1/0251* (2013.01); *H01R 12/55* (2013.01); *H05K 1/0219* (2013.01); *H05K 1/0222* (2013.01); *H05K 2201/10356* (2013.01)

(58) Field of Classification Search
CPC .... H01R 12/55; H05K 1/0251; H05K 1/0219; H05K 1/0222; H05K 2201/10356
USPC ........................................................ 439/581
See application file for complete search history.

(56) References Cited

U.S. PATENT DOCUMENTS

| | | | | |
|---|---|---|---|---|
| 2,869,090 | A * | 1/1959 | Johanson | H01R 24/50 439/79 |
| 3,383,457 | A * | 5/1968 | Schumacher | H01R 24/52 174/75 C |
| 3,514,737 | A * | 5/1970 | Renshaw | H01R 24/50 439/63 |
| 3,910,665 | A * | 10/1975 | Stull | H01R 24/50 439/63 |
| 4,690,471 | A * | 9/1987 | Marabotto | H01R 24/50 439/246 |
| 4,795,352 | A * | 1/1989 | Capp | H01R 24/50 439/63 |

(Continued)

FOREIGN PATENT DOCUMENTS

| | | |
|---|---|---|
| CA | 1056027 A | 6/1979 |
| DE | 10312515 A1 | 10/2004 |

(Continued)

*Primary Examiner* — Abdullah A Riyami
*Assistant Examiner* — Vladimir Imas
(74) *Attorney, Agent, or Firm* — Suiter Swantz pc llo

(57) ABSTRACT

A through connector device is disclosed. The device may include a coaxial cable receiver portion defined by one or more surfaces, the coaxial cable receiver portion configured to couple to a center conductor portion of a coaxial cable, the center conductor portion of the coaxial cable protruding above a dielectric material of the coaxial cable. The device may include a beam lead positioned adjacent to the coaxial cable receiver portion. The device may include a planar transmission line contact pad configured to make electrical contact with a planar transmission line of a printed circuit board. The device may include a step configured to electrically and mechanically couple the beam lead to the planar transmission line contact pad, the step configured to create a gap between a bottom surface of the beam lead and a top surface of an outer conductor portion of the coaxial cable.

8 Claims, 5 Drawing Sheets

(56) References Cited

U.S. PATENT DOCUMENTS

| | | | |
|---|---|---|---|
| 4,975,066 A * | 12/1990 | Sucheski | H01R 13/11 |
| | | | 439/699.1 |
| 5,246,384 A * | 9/1993 | Sato | H01R 9/0518 |
| | | | 439/585 |
| 5,308,250 A | 5/1994 | Walz | |
| 5,477,159 A * | 12/1995 | Hamling | G01R 1/06772 |
| | | | 324/755.05 |
| 5,735,695 A * | 4/1998 | Heinrich | H01R 43/0256 |
| | | | 439/63 |
| 5,823,790 A * | 10/1998 | Magnuson | H01R 24/50 |
| | | | 333/260 |
| RE36,065 E | 1/1999 | Andrews et al. | |
| 5,906,512 A | 5/1999 | Reynolds | |
| 6,142,788 A | 11/2000 | Han | |
| 6,870,448 B2 | 3/2005 | Whitener et al. | |
| 6,878,011 B2 | 4/2005 | Laub et al. | |
| 6,971,913 B1 * | 12/2005 | Chu | H01R 9/0518 |
| | | | 439/585 |
| 6,980,068 B2 * | 12/2005 | Miyazawa | H01P 1/047 |
| | | | 333/260 |
| 7,042,318 B2 | 5/2006 | Barnes et al. | |
| 7,794,253 B2 | 9/2010 | Wang et al. | |
| 8,035,466 B2 | 10/2011 | Payne | |
| 8,212,154 B2 * | 7/2012 | Kashiwakura | H05K 1/116 |
| | | | 174/262 |
| 8,894,444 B2 | 11/2014 | Funahashi | |
| 9,013,891 B2 * | 4/2015 | Song | H05K 1/0243 |
| | | | 361/748 |
| 9,437,912 B2 * | 9/2016 | Song | H01P 1/047 |
| 9,728,929 B2 * | 8/2017 | Patzner | H01R 9/0515 |
| 9,843,135 B2 * | 12/2017 | Guetig | H01R 13/665 |
| 10,608,356 B2 * | 3/2020 | Spitzner | H01R 12/58 |
| 10,658,772 B1 * | 5/2020 | Cress | H05K 1/0265 |
| 10,833,461 B2 * | 11/2020 | Wang | H05K 3/34 |
| 2006/0044083 A1 * | 3/2006 | Kuzmenka | H01P 1/047 |
| | | | 333/246 |
| 2007/0054510 A1 | 3/2007 | Price | |
| 2014/0342581 A1 | 11/2014 | Clyatt et al. | |
| 2020/0395716 A1 | 12/2020 | Kim et al. | |

FOREIGN PATENT DOCUMENTS

| | | |
|---|---|---|
| EP | 0678221 A1 | 10/1995 |
| EP | 1596477 B1 | 9/2012 |
| GB | 2379096 A | 2/2003 |
| IN | 106356658 B | 1/2019 |
| JP | 1985038833 B2 | 9/1985 |
| JP | 2000040543 A | 2/2000 |
| KR | 101177866 B1 | 8/2012 |
| KR | 101311738 B1 | 9/2013 |

* cited by examiner

WIDE BAND PRINTED CIRCUIT BOARD THROUGH CONNECTOR

BACKGROUND

In two-sided printed circuit boards (PCBs), radio frequency (RF) power often must be transmitted from one side of the PCB to the other side of the PCB. Efficient RF power transfer requires controlled impedance at high frequencies to prevent RF power from being reflected back to the RF source. Further, efficient RF power transfer requires the RF power to be contained within a desired transmission line.

SUMMARY

A through connector device is disclosed, in accordance with one or more embodiments of the disclosure. The device includes a coaxial cable receiver portion defined by one or more surfaces, the coaxial cable receiver portion configured to couple to a center conductor portion of a coaxial cable, the center conductor portion of the coaxial cable protruding above a dielectric material of the coaxial cable. The device includes a beam lead positioned adjacent to the coaxial cable receiver portion. The device includes a planar transmission line contact pad configured to make electrical contact with a planar transmission line of a printed circuit board. The device includes a step configured to electrically and mechanically couple the beam lead to the planar transmission line contact pad, the step configured to create a gap between a bottom surface of the beam lead and a top surface of an outer conductor portion of the coaxial cable.

In some embodiments, at least one of a width or length of the beam lead may be adjusted to tune impedance of the printed circuit board.

In some embodiments, the dielectric material may be trimmed prior to coupling the center conductor portion to the coaxial cable portion.

In some embodiments, the center conductor portion may be coupled to the coaxial cable receiver portion via soldering.

In some embodiments, the planar transmission line contact pad may be configured to couple to the planar transmission line of the printed circuit board.

In some embodiments, the planar transmission line contact pad may be coupled to the planar transmission line of the printed circuit board via soldering.

In some embodiments, a height of the gap between the bottom surface of the beam lead and the top surface of the outer conductor portion of the coaxial cable and a height of the step may be equal.

A system is disclosed, in accordance with one or more embodiments of the disclosure. The system includes one or more through connector devices. Each through connector device includes a coaxial cable receiver portion defined by one or more surfaces, the coaxial cable receiver portion configured to couple to a center conductor portion of a coaxial cable, the center conductor portion of the coaxial cable protruding above a dielectric material of the coaxial cable. Each through connector device includes a beam lead positioned adjacent to the coaxial cable receiver portion. Each through connector device includes a planar transmission line contact pad configured to make electrical contact with a planar transmission line of a printed circuit board. Each through connector device includes a step configured to electrically and mechanically couple the beam lead to the planar transmission line contact pad, the step configured to create a gap between a bottom surface of the beam lead and a top surface of an outer conductor portion of the coaxial cable. The system includes a multi-layered printed circuit board stack-up. The stack-up includes one or more printed circuit board layers, the one or more printed circuit board layers configured to be laminated together. The stack-up includes one or more planar transmission lines, the one or more planar transmission lines including a first planar transmission line on a first side of the multi-layered printed circuit board stack-up and an additional planar transmission line on an additional side of the multi-layered printed circuit board stack-up. The stack-up includes one or more planar transmission ground planes, at least one of the one or more planar transmission ground planes positioned between a first printed circuit board layer and an adjacent printed circuit board layer. The stack-up includes a plated through hole, the plated through hole configured to receive a portion of the coaxial cable, the plated through hole configured to make electrical contact with an outer surface of the outer conductor portion of the coaxial cable. The one or more through connector devices configured to interconnect the first planar transmission line and the additional planar transmission line.

In some embodiments, at least one of a width or length of the beam lead may be adjusted to tune impedance of the printed circuit board.

In some embodiments, the dielectric material may be trimmed prior to coupling the center conductor portion to the coaxial cable portion.

In some embodiments, the planar transmission line contact pad may be configured to couple to the planar transmission line of the printed circuit board.

In some embodiments, the planar transmission line contact pad may be coupled to the planar transmission line of the printed circuit board via soldering.

In some embodiments, a height of the gap between the bottom surface of the beam lead and the top surface of the outer conductor portion of the coaxial cable and a height of the step may be equal.

In some embodiments, the center conductor portion may be coupled to the coaxial cable receiver portion via soldering.

In some embodiments, the one or more through connector devices are formed of at least one of: coper or gold.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are examples and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION OF THE INVENTION

Figure 1:
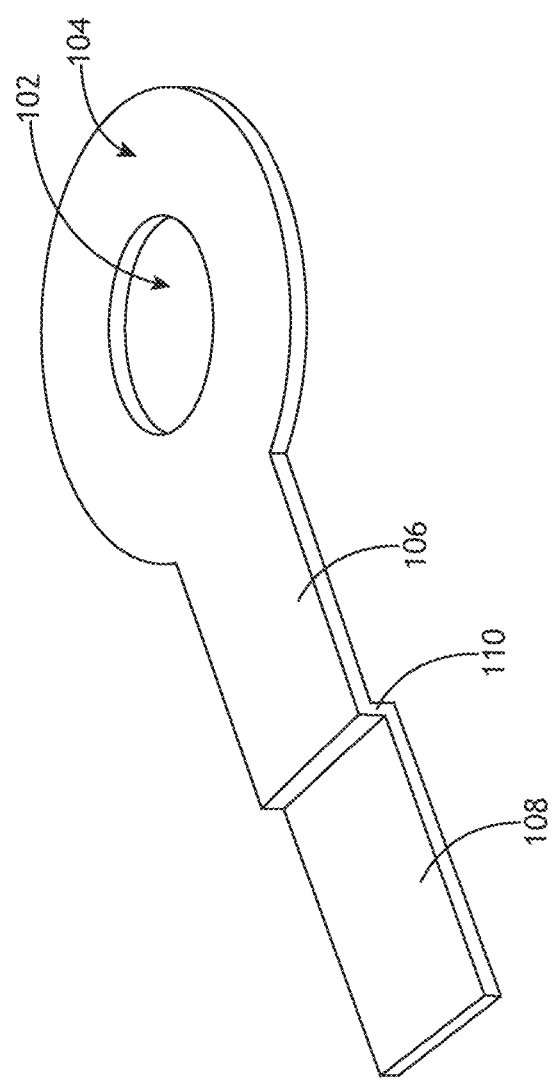
FIG. 1 illustrates a simplified schematic of a through connector, in accordance with one or more embodiments of the disclosure.

Reference will now be made in detail to the subject matter disclosed, which is illustrated in the accompanying drawings.

Before explaining one or more embodiments of the disclosure in detail, it is to be understood the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of or sub-combination of two or more such features, along with any other features which may not necessarily be expressly described or inherently present in the instant disclosure.

FIGS. 1-4 in general illustrate a through connector for use within a system to transfer RF power, in accordance with one or more embodiments of the disclosure.

Figure 5:
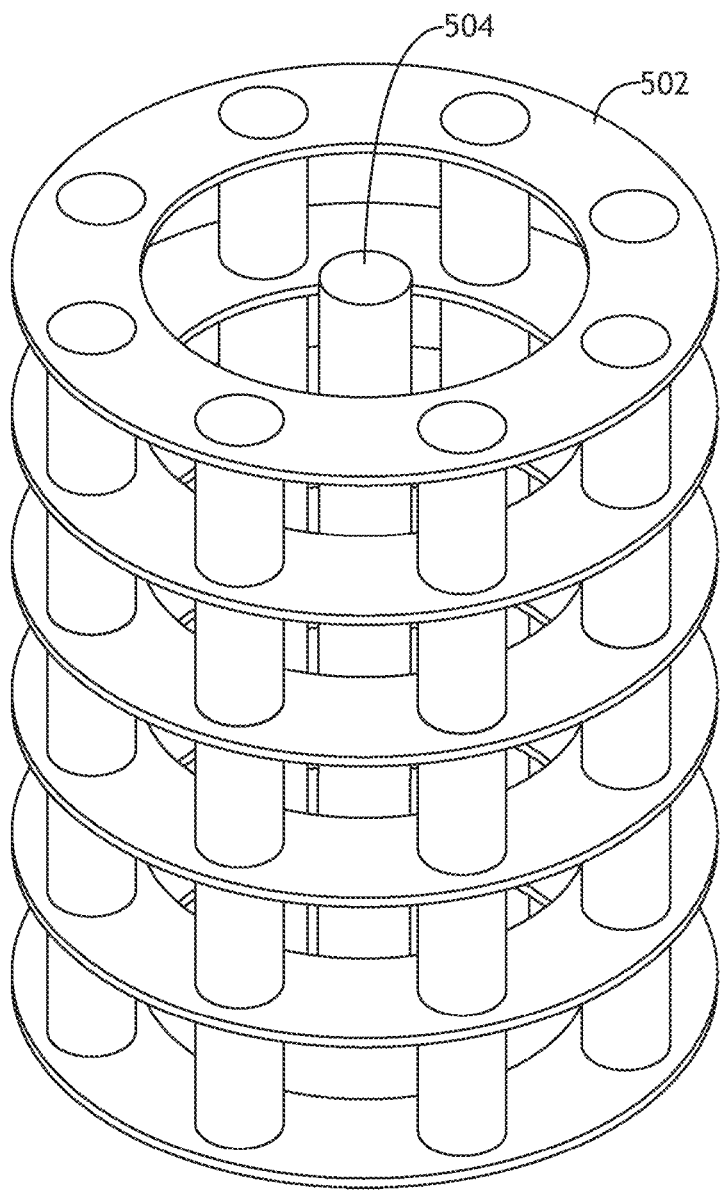
FIG. 5 illustrates a simplified schematic of a conventional system.

In two-sided printed circuit boards (PCBs), radio frequency (RF) power often must be transmitted from one side of the PCB to the other side of the PCB. Efficient RF power transfer requires controlled impedance at high frequencies to prevent RF power from being reflected back to the RF source. Further, efficient RF power transfer requires the RF power to be contained within a desired transmission line. Conventionally, quasi-coaxial transmission line structures (e.g., such as the structure 500 shown in FIG. 5 including annular rings 502 surrounding a plated through hole interconnect 504) are used to transfer RF power. However, these quasi-coaxial structures have bandwidth limitation. Further, there is a risk of unwanted RF leakage between adjacent metal structures within the PCB laminates. Further, the quasi-coaxial design is highly complex for laminates of multiple board layers.

As such, it would be desirable to provide a through connector for a multi-layered PCB stack-up. The through connector should be configured to make electrical contact with a planar transmission line formed on the surface of the PCB and should be configured to receive a section of a coaxial cable penetrating through the PCB. The through connector should include a step in a beam lead to provide an offset to elevate the through connector above the through hole when the connector makes electrical contact with the planar transmission line. The through connector should provide a hole through which a center conductor of the coaxial cable can be inserted for electrical contact. The through connector should provide a beam lead to bridge the distance between the outer shield and the center conductor of the coaxial cable.

Further, it would be desirable to provide a system for RF power transfer for multi-layered PCBs including a plurality of through connectors. For example, the system may include a top connector and a bottom connector, where the connectors should interconnect a planar transmission line positioned on the top side of the PCB with a planar transmission line positioned on the bottom side when assembled to the coaxial cable. The system should enable wide band connections through PCB layers without reliance on designed interlayer PCB metal patterns to control the RF impedance of the structure. The system should contain RF power to suppress electromagnetic interference (EMI). The system should reduce design time and improve signal integrity for RF PCBs requiring transfer of RF power from one side of the PCB to the other.

Figure 2:
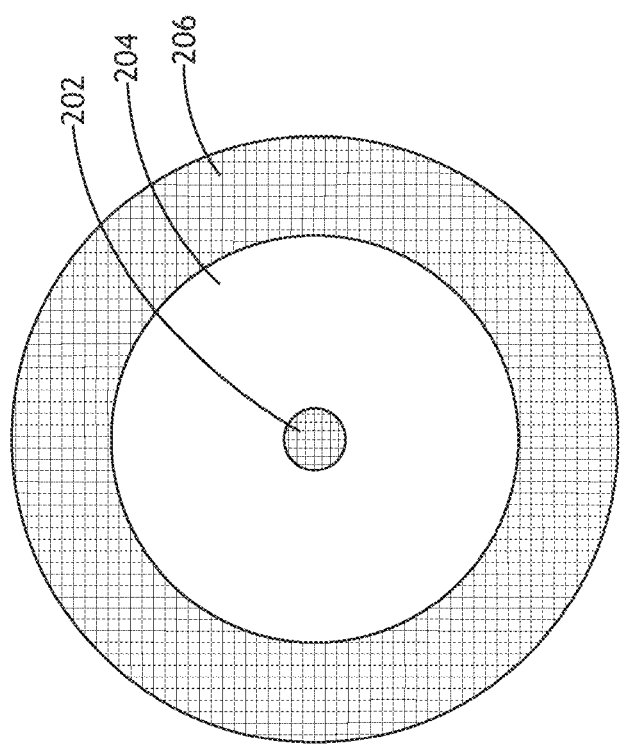
FIG. 2 illustrates a top view of a coaxial cable, in accordance with one or more embodiments of the disclosure.
Figure 3:
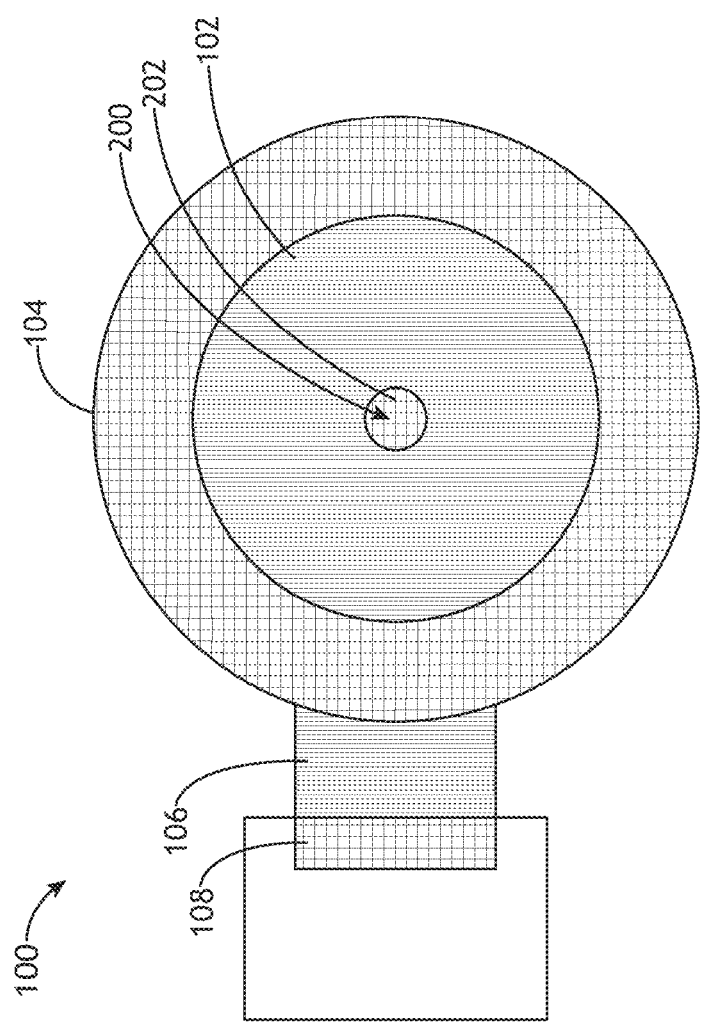
FIG. 3 illustrates a top view of the through connector and coaxial cable, in accordance with one or more embodiments of the disclosure.

FIGS. 1-3 generally illustrate a through connector 100 for use with a system (such as the system 400 shown in FIG. 4), in accordance with one or more embodiments of the disclosure.

The through connector 100 may include a coaxial cable receiver portion 102 defined by one or more surfaces 104. For example, the coaxial cable receiver portion 102 may be configured to receive a portion of a coaxial cable (such as the cable 200 shown in FIG. 2). For instance, the receiver portion 102 may be configured to receive a center conductor portion 202 of the coaxial cable.

Referring to FIG. 2, the coaxial cable 200 may include a center conductor portion 202, a dielectric portion 204 formed of a dielectric material, and an outer shield conductor portion 206. The outer conductor 206 surrounds a layer of dielectric material (e.g., the dielectric portion 204) and the dielectric material prevents the outer conductor 206 from making contact with the center conductor 202 of the cable. The signal is transferred through the cable via the center conductor 202. The dielectric material forming the dielectric portion 204 may include any type of dielectric material known in the art including, but not limited to, polytetrafluoroethylene (Teflon™), or the like.

The coaxial cable 200 may be trimmed prior to inserting the cable 200 into the receiver portion 102. For example, the coaxial dielectric portion 204 may be trimmed to expose the center conductor portion 202, such that the center conductor 202 may protrude beyond the coaxial dielectric portion 204.

The coaxial cable 200 may be coupled to the through connector 100, after the cable 200 has been trimmed, to maintain an electrical connection between the coaxial cable 200 and the through connector 100. For example, the center conductor portion 200 may be coupled to the receiver portion 102 of the through connector 100 via one or more fabrication processes (e.g., soldering, welding, or the like). In this regard, the receiver portion 102 and/or the one or more surfaces 104 may not make contact with the outer conductor portion 206 and/or dielectric material 204 of the coaxial cable, such that the signal is not shortened and the dielectric material 204 is not damaged (e.g., burned/melted).

Although FIGS. 1-3 depict the coaxial cable receiver portion 102 and/or the one or more surfaces 104 as specific shapes, it is noted that the coaxial cable receiver portion 102 and/or the one or more surfaces 104 may be any shape and/or size suitable for receiving a portion of the coaxial cable 200 (e.g., the center conductor 202 of the cable 200).

It is noted that the through connector 100 may be formed of any mechanically rigid and electrically conductive material known in the art including, but not limited to, gold, coper, or the like.

Figure 4:
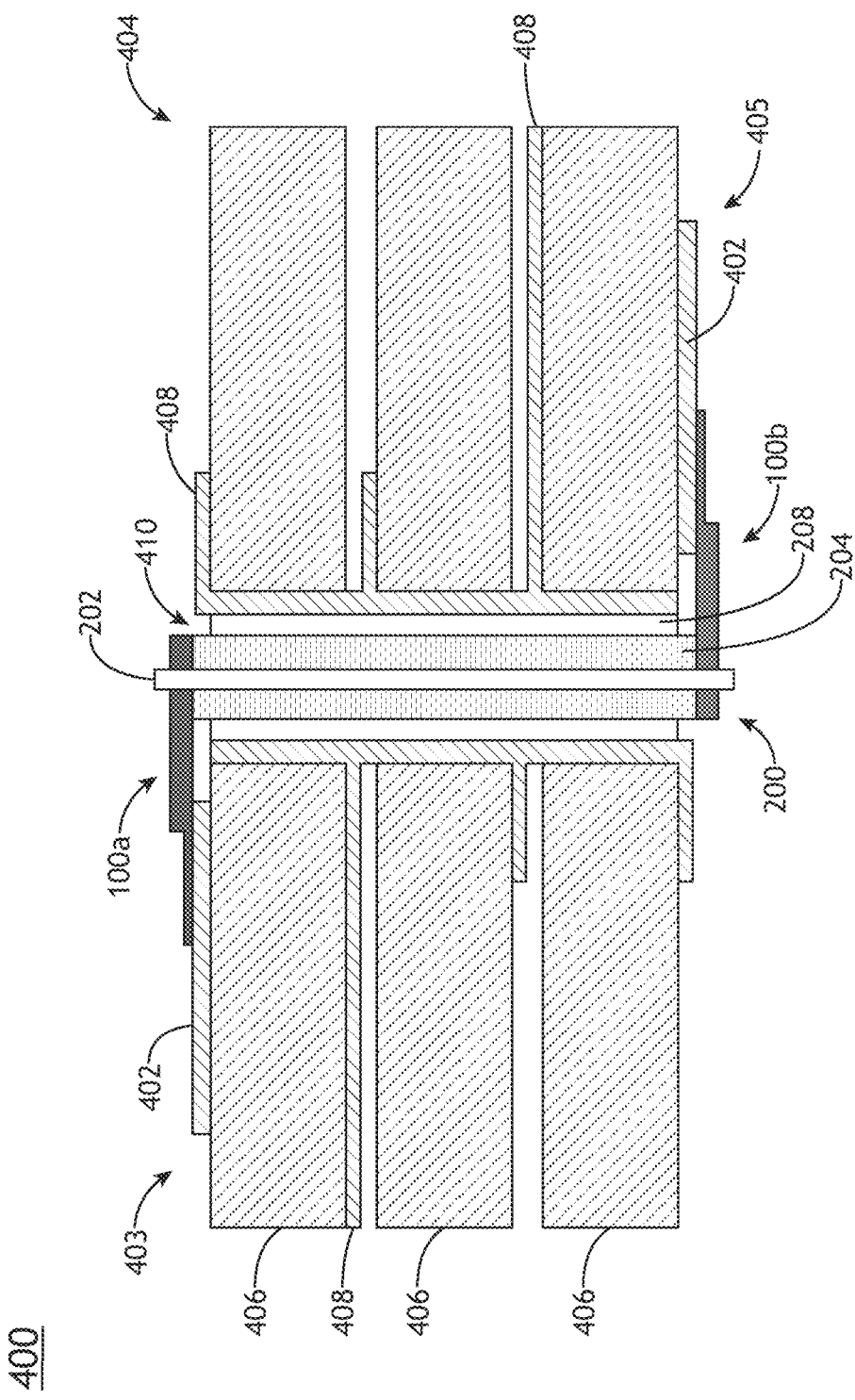
FIG. 4 illustrates a simplified schematic of a system including the one or more through connectors, in accordance with one or more embodiments of the disclosure.

The through connector 100 may include a beam lead 106 positioned adjacent to the receiver portion 102. For example, the beam lead 106 may be flush/planar with the one or more surfaces 104 that define the receiver portion 102 (e.g., hole 102). In this regard, as shown in FIG. 4, there may be a controlled, predetermined distance between the one or more surfaces 104 and the surface of the outer conductor 206 of the coaxial cable 200. Further, the beam lead 106 may be configured to span the length of the dielectric material and the outer conductor of the cable 200.

The beam lead 106 may be used as a tuning hook to tune impedance of the signal connection. For example, one or more dimensions of the beam lead 106 may be adjusted to tune impedance. For instance, the width of the beam lead 106 may be adjusted. In another instance, the length of the beam lead 106 may be adjusted.

The through connector 100 may include a planar transmission line contact pad 108 configured to make electrical contact with a planar transmission line 402. The planar transmission line contact pad 108 may be coupled to the planar transmission line 402 of the PCB stack-up 404 via one or more fabrication processes (e.g., soldering, welding, or the like).

The through connector 100 may include a step 110 configured to electrically and mechanically couple the beam lead 106 to the planar transmission line contact pad 108.

The step 110 may be configured to create a gap between the beam lead 106 and the outer conductor 206 of the coaxial cable 200. For example, the step 110 may be a consistent height to create a predetermined gap between the beam lead 106 and the outer conductor 206, such that the signal between the center conductor 202 and the transmission line 402 is not shorted. Although FIGS. 1 and 4 depict the step 110 dimensioned as a 90 degree angle, it is noted that the step 110 may have any angle and/or slope suitable for creating a consistent gap between the beam lead 106 and the outer conductor 206. Therefore, the above discussion and related figures should not be construed as limiting the scope of the present disclosure.

It is noted that one or more components of the through connector 100 may be fabricated from any suitable solderable material (e.g., coper, gold, or the like) using any fabrication technique known in the art (e.g., stamping, or the like). Further, it is noted that the through connector 100 may be formed of a single piece of solderable material or be formed of multiple pieces of solderable material.

FIG. 4 depicts a system 400 for transferring RF power in a multi-layered PCB stack-up 404, in accordance with one or more embodiments of the disclosure. It is noted that the description of the various embodiments, components, and operations described previously herein with respect to the through connector 100 should be interpreted to extend to the system 400, and vice versa.

The system 400 may include a plurality of through connectors 100. For example, the system 400 may include a top connector 100a positioned on a top side 403 of the PCB stack up 404 and a bottom connector 100b positioned on a bottom side 405 of the PCB stack-up 404. For purposes of the present disclosure, the terms "printed circuit board" (or PCB) and "printed wire board" (or PWB) may be used interchangeably throughout the present disclosure, unless otherwise noted herein.

The system 400 may include one or more planar transmission lines 402 positioned on the one or more sides of the PCB stack-up 404. For example, a top transmission line 402 may be positioned on a top side 403 of the PCB stack-up 404 and a bottom transmission line 402 may be positioned on a bottom side 405 of the PCB stack-up 404.

The one or more planar transmission lines 402 of the system 400 may be configured to mechanically and electrically couple to the plurality of through connectors 100. For example, the top planar transmission line 402 may be configured to mechanically and electrically couple to the top through connector 100a positioned on the top side 403 of the PCB stack-up. For instance, the top planar transmission line 402 may be configured to mechanically and electrically couple to the planar transmission line contact pad 108 of the top through connector 100a. By way of another example, the bottom planar transmission line 402 may be configured to mechanically and electrically couple to the bottom through connector 100b positioned on the bottom side 405 of the PCB stack-up. For instance, the bottom planar transmission line 402 may be configured to mechanically and electrically couple to the planar transmission line contact pad 108 of the bottom through connector 100b. In this regard, the plurality of through connectors 100 may interconnect the one or more planar transmission lines 402.

It is noted that the one or more planar transmission lines 402 of the system 400 may be configured to couple to the plurality of through connectors 100 (e.g., the contact pads 108 of the through connectors 100a, 100b) via any fabrication process known in the art such as, but not limited to, soldering, or the like.

The system 400 may include a multi-layered PCB stack-up 404 including one or more PCB layers 406. For example, the one or more PCB layers 406 may be laminated together to form the multi-layered PCB stack-up 404. Although FIG. 4 depicts the PCB stack-up 404 including a specific configuration of PCB layers 406 (e.g., number, size, or the like), it is noted that the PCB stack-up 404 may include any configuration of PCB layers 406 (e.g., number, size, or the like).

The multi-layered PCB stack-up 404 may include one or more planar transmission line ground planes 408. For example, between the one or more PCB layers 406, the PCB stack-up 404 may include the one or more planar transmission line ground planes 408. The one or more planar transmission line ground planes 408 may be formed of any material known in the art including, but not limited to, gold, coper, or the like.

The PCB stack-up 404 may include a through hole 410 configured to receive a portion of the coaxial cable 200. For example, as shown in FIG. 4, the PCB stack-up 404 may include a plated through hole 410 configured to receive the coaxial cable 200. In this regard, the outer conductor 206 of the coaxial cable 200 and the metallization of the plated through hole 410 may be in direct contact.

The through hole 410 may be dimensioned such that the diameter of the through hole 410 is greater than the diameter of the coaxial cable 200, such that the coaxial cable 200 may be inserted within the hole 410. For example, the diameter of the through hole 410 may be slightly greater than the diameter of the coaxial cable 200, such that there is a continuous connection between the outer conductor 206 of the cable 200 and the metallization of the plated through hole 410 without creating too much of a gap between the outer conductor 206 of the cable 200 and the inner walls of the plated through hole 410. It is noted that by creating a continuous ground connection with the coaxial cable and by eliminating any gaps within the stack-up, EMI and RF leakage is decreased.

As discussed previously herein, the coaxial cable 200 may be trimmed prior to coupling the cable 200 to the receiver portion 102. For example, the coaxial dielectric portion 204 may be trimmed to expose the center conductor portion 202 of the cable 200, such that the center conductor 202 may protrude beyond the coaxial dielectric portion 204. For instance, both ends of the coaxial cable 200 may be trimmed to create a height difference between the through connectors 100a, 100b and the dielectric portion 204/outer portion 206 of the cable, such that the center conductor portions 202 on each end protrude beyond the coaxial dielectric 204 and outer conductor 206.

RF signal may be transferred from the top side 403 of the PCB stack-up 404 to the bottom side of the PCB stack-up 404, and vice versa, using the one or more through connectors 100. For example, the one or more through connectors 100 may be configured to electrically couple the one or more planar transmission lines 402 of the stack-up 404 to the center conductor 202 of the coaxial cable 200, such that the signal is transferred from one side of the PCB stack-up 404 to the other side of the PCB stack-up 404.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A system comprising:
   one or more through connector devices, each through connector device comprising:
   a coaxial cable receiver portion defined by one or more surfaces, the coaxial cable receiver portion configured to couple to a center conductor portion of a coaxial cable, the center conductor portion of the coaxial cable protruding above a dielectric material of the coaxial cable;
   a beam lead positioned adjacent to the coaxial cable receiver portion;
   a planar transmission line contact pad configured to make electrical contact with a planar transmission line of a printed circuit board; and
   a step configured to electrically and mechanically couple the beam lead to the planar transmission line contact pad, the step configured to create a gap between a bottom surface of the beam lead and a top surface of an outer conductor portion of the coaxial cable; and
   a multi-layered printed circuit board stack-up, the multi-layered printed circuit board stack-up comprising:
   one or more printed circuit board layers, the one or more printed circuit board layers configured to be laminated together;
   one or more planar transmission lines, the one or more planar transmission lines including a first planar transmission line on a first side of the multi-layered printed circuit board stack-up and an additional planar transmission line on an additional side of the multi-layered printed circuit board stack-up;
   one or more planar transmission ground planes, at least one of the one or more planar transmission ground planes positioned between a first printed circuit board layer and an adjacent printed circuit board layer; and
   a plated through hole, the plated through hole configured to receive a portion of the coaxial cable, the plated through hole configured to make electrical contact with an outer surface of the outer conductor portion of the coaxial cable;
   the one or more through connector devices configured to interconnect the first planar transmission line and the additional planar transmission line.

2. The system of claim 1, wherein at least one of a width or length of the beam lead is adjusted to tune impedance of the printed circuit board.

3. The system of claim 1, wherein the dielectric material is trimmed prior to coupling the center conductor portion to the coaxial cable receiver portion.

4. The system of claim 1, wherein the planar transmission line contact pad is configured to couple to the planar transmission line of the printed circuit board.

5. The system of claim 4, wherein the planar transmission line contact pad is coupled to the planar transmission line of the printed circuit board via soldering.

6. The system of claim 1, wherein a height of the gap between the bottom surface of the beam lead and the top surface of the outer conductor portion of the coaxial cable and a height of the step is equal.

7. The system of claim 1, wherein the center conductor portion is coupled to the coaxial cable receiver portion via soldering.

8. The system of claim 1, wherein the one or more through connector devices are formed of at least one of:
   copper or gold.

* * * * *